(12) United States Patent
Beck

(10) Patent No.: US 9,468,119 B2
(45) Date of Patent: Oct. 11, 2016

(54) HOUSING ELEMENT FOR A CONTROL DEVICE HOUSING USED IN A MOTOR VEHICLE

(75) Inventor: Werner Beck, Amberg (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 170 days.

(21) Appl. No.: 14/238,002

(22) PCT Filed: Jul. 24, 2012

(86) PCT No.: PCT/EP2012/064480
§ 371 (c)(1),
(2), (4) Date: Feb. 10, 2014

(87) PCT Pub. No.: WO2013/023881
PCT Pub. Date: Feb. 21, 2013

(65) Prior Publication Data
US 2014/0166332 A1  Jun. 19, 2014

(30) Foreign Application Priority Data
Aug. 16, 2011 (DE) .................. 10 2011 080 988

(51) Int. Cl.
H05K 5/06 (2006.01)
H05K 5/00 (2006.01)

(52) U.S. Cl.
CPC ............ *H05K 5/06* (2013.01); *H05K 5/0052* (2013.01); *H05K 5/062* (2013.01); *Y10T 29/49002* (2015.01)

(58) Field of Classification Search
CPC ...... H05K 5/06; H05K 5/0052; H05K 5/062; H05K 5/064; H02G 3/088; H01R 13/52; H01R 13/5202; H01R 13/521; H01R 13/5216; H01R 13/5219; B21D 39/02; Y10T 29/49002; Y10T 29/49826; Y10T 29/49906; Y10T 29/49908
USPC .............. 361/752, 736, 679.01, 601; 174/50, 174/50.5, 559, 564; 29/592.1
See application file for complete search history.

(56) References Cited

U.S. PATENT DOCUMENTS 4,409,641 A * 10/1983 Jakob ................. H05K 7/20854
  361/720
5,719,746 A *  2/1998 Ohbuchi .......... G06K 19/07745
  206/706

(Continued)

FOREIGN PATENT DOCUMENTS

DE  36 39 440 C1  2/1988
DE  195 05 125 A1  8/1995

(Continued)

OTHER PUBLICATIONS

German Patent Office Search Report, Aug. 22, 2012.

(Continued)

*Primary Examiner* — Dimary Lopez Cruz
(74) *Attorney, Agent, or Firm* — Dority & Manning P.A.

(57) ABSTRACT

A housing element for a control unit housing has one or more first edge sections for contact with a second edge section of a second housing element allocated to the control unit housing an intermediate layer of sealant is able to be hardened with the assistance of air moisture, whereas at least one of the first edge sections features at least one recess for the communication of the sealant in the state of contact of the housing elements with air containing the air moisture.

13 Claims, 3 Drawing Sheets

(56) References Cited

U.S. PATENT DOCUMENTS

| | | |
|---|---|---|
| 6,407,925 B1 | 6/2002 | Kobayashi et al. |
| 7,120,030 B2 | 10/2006 | Azumi et al. |
| 7,916,491 B2 * | 3/2011 | Fino .................. H05K 7/20454 174/520 |
| 8,014,158 B2 * | 9/2011 | Kojima ................ H05K 5/0052 174/50.5 |
| 2007/0230143 A1 * | 10/2007 | Inagaki ............... B60R 16/0239 361/752 |
| 2012/0162944 A1 | 6/2012 | Brantsch |

FOREIGN PATENT DOCUMENTS

| | | |
|---|---|---|
| DE | 10 2007 015938 A1 | 12/2008 |
| EP | 1976357 A2 | 10/2008 |
| JP | 2002 271064 | 9/2002 |
| JP | 2010 071348 | 4/2010 |

OTHER PUBLICATIONS

PCT Search Report and Written Opinion, Feb. 22, 2013.
PCT International Preliminary Examination Report, Jan. 23, 2014.

* cited by examiner

HOUSING ELEMENT FOR A CONTROL DEVICE HOUSING USED IN A MOTOR VEHICLE

FIELD OF THE INVENTION

This invention relates to a housing element for a control unit housing, in particular a housing element for a control unit housing used in a motor vehicle.

BACKGROUND

Typically, a control unit housing accommodates electronic components, such as an electronic circuit or a control unit, and protects them against environmental influences or mechanical stress. For this purpose, a control unit housing features at least two housing elements that are connectable with each other; in the connected state, they are able to form a housing interior for accommodating the electronic components. In general, the housing elements are connected with each other in an edge area bordering the housing interior with an intermediate layer of a sealant, in order to seal the housing interior to the outside of the housing. The sealant may be, for example, a sealant based on at least one silicone component, which is able to harden under the influence of the air moisture contained in the ambient air. The edge area of the housing elements may be connected to each other in a variety of ways. Thus, for example, friction-locked connections such as screw connections, form-fitting connections such as rear-engagement means of one edge area at another edge area, or adhesive connections such as glue joints are used. One problem with the use of sealant that hardens with the assistance of air moisture is a complete hardening of the sealant in a connected state of the housing elements forming the housing.

DE 195 05 125 A1 discloses a housing for a motor vehicle control unit, whereas the housing comprises two housing elements, which are connected to each other in the edge area with an intermediate layer of a sealant with the assistance of a rear-engaging form-fitting connection.

DE 103 49 573 A1 shows a housing for an electronic circuit used in a motor vehicle, whereas the housing comprises two housing elements, which are connected to each other with an intermediate layer of a liquid silicone rubber that hardens at room temperature by means of a screw connection.

SUMMARY OF THE INVENTION

Additional objects and advantages of the invention will be set forth in part in the following description, or may be obvious from the description, or may be learned through practice of the invention.

With the proposed housing element according to an embodiment of the invention, a sufficient hardening of a sealant that is able to be hardened with the assistance of air moisture in a connected state of the housing elements can be guaranteed. Such a sealant is preferably a sealant based on silicone, which, also preferably, hardens at ambient temperature. For the hardening of the sealant, the proportion of air moisture preferably contained in the ambient air is sufficient. A permanent bonding of the sealant with the ambient air containing air moisture or an alternative, preferred supply of a gas containing air moisture to the sealant, is achieved through the recess, by which the complete hardening of the sealant in the connected state of the housing elements can be ensured.

A recess for the purposes of this invention is a passage that connects at least two surface sides of the housing element pointing in different directions to each other. Preferably, the housing element in the edge section is formed in a flat or curved manner with a predetermined, defined wall thickness, whereas the recess ranges from a first surface side of the housing element shown in a first direction, to a second surface side of the housing element shown in an opposite second direction.

In addition, the edge section forms at least one partial cut of an edge and/or external edge fully bounding the housing element. The edge section preferably features such a dimension that the edge section in the circumferential direction of the housing element constitutes at least one fractional length of the edge and, in a parallel direction running from an external edge to a middle of the housing element of a near end from the external edge to an internal housing, has a length extending for contact with the contact surface provided with the second edge section of the second housing element. The edge may preferably form a collar that is circumferential to the housing element, fully or at least in sections.

The housing element may include one or more edge sections, whereas, if there is an even number of edge sections, these are preferably arranged opposite to the edge sides of the housing element. It is further preferable that the housing element may include several edge sections distributed around the edge of the housing element, which are arranged in equal distances from each other in the circumferential direction of the edge. Any possible arrangement of a majority of edge sections with the same, varying or a combination of the same or varying intervals, is conceivable. Preferably, a number of edge sections and their arrangement around the full edge are selected in such a manner that the sealant is able to be evenly hardened over the full length of its extension by means of the recess formed in the respective edge section. For example, the edge in a top view is able to form preferably a rectangular, even more preferably a quadrangular, housing element, whereas opposite edge sides, or alternatively each edge side, include at least one edge section with at least one recess. It is further preferable that the edge section extends along one edge side in such a manner that one or more corner points of the rectangular housing element remains recessed from the edge section. In these corner points, freely accessible holes for example, for mounting the housing element and/or of the housing formed with the housing element are able to be provided at its point of use, such as a motor vehicle engine compartment or a motor vehicle transmission.

It is further preferable that the edge section may feature more than one recess, which further preferably may be arranged in equal distances from one another and/or with an identical formation along the edge section. Thus, the uniform hardening of the sealant can be further improved. Alternatively, the edge section may feature a recess formed roughly across the entire extension length of the edge section.

Additional preferred embodiments of the housing element are described herein.

According to another preferred embodiment, the sealant can be protected against damage. Although a formation of the recess in an area that partially overlaps the sealant, or is directly adjacent to the sealant, would be conceivable, the housing element may, for example, provide a comprehensive control unit housing in a motor vehicle in locations that may be subject to a possible direct impact of foreign media, such as a high-pressure water jet or a rock fall. Through the arrangement of the recess in an area removed from the sealant, such a direct impact damaging the sealant can be avoided. The supply of air moisture necessary for the hardening of the sealant may take place across distances caused by manufacturing tolerances between the contact surfaces of the particular housing elements forming the housing provided in the area between the recess and the sealant. Preferably, the supply of air moisture through a supply channel, which is further preferably arranged adjacent to the recess and an area in which the sealant is provided. Preferably, the supply channel may be formed in the edge section of the housing element. Alternatively, the supply channel may be preferably provided in the second edge section of the second housing element. A further alternative is that each of the edge sections of the housing elements provided for mutual contact preferably has a supply channel section, which forms a supply channel in the connected state of the housing elements. In general, an intermediary space created between the first and second edge section is to be provided under a supply channel; through this, the air moisture is able to be supplied to the sealant. Such an air supply channel may be achieved, for example, in a simple manner through a predetermined measure carrying away surface material in the edge section—contact area of the housing element.

The area for contacting or for taking in the sealant is preferably a groove circumferential to the housing interior, which is able to be formed in the first and/or second edge section. In this preferred embodiment, the supply channel extends from at least one recess to the groove. It is further preferable that, through the supply channel, the sealant that is able to be hardened by means of air moisture is supplied to the groove in liquid form. Additional supply channels for the supply of the sealant in the groove and/or for the sealant contact area or in the sealant intake area may be provided with the housing element and/or the second housing element.

In addition, in an area opposite to the groove, one of the housing elements may form an elevation, which extends into the supplied sealant in the joined state of the housing. Thus, a sealing surface formed between the housing elements may be enlarged, and/or, after a partial hardening of the sealant and the subsequent bonding of the housing elements, the pressure applying to the sealants may be increased, by which the sealing function may be further improved.

According to a preferred embodiment with other characteristics, a cost-effective and simple solution for the mutual fastening of the housing elements forming the housing is provided. As a result, fastening means such as screws or latches may be omitted.

In this preferred embodiment, the edge section is formed in a bendable manner. For this purpose, the housing element is formed preferably in the edge area made of a metal featuring the edge section, which is further preferably repeatedly deformed and/or bent, without being subject to a bending fracture at the point of bending. It is further preferable that the housing element can be fully formed from a metal such as, for example, aluminum, in order to provide a heat sink for the electronic components able to be taken into the housing. Through the housing element, the heat produced by the electronic components can be dissipated in the usual manner.

Further, in this preferred embodiment, the edge section is bendable in a U-shape for bordering the second edge section in a clamping manner. With a U-shape, for the purposes of this invention, a C-shape, a W-shape or any other shape is also meant, by means of which the second edge section is able to be clamped at the border. In other words, the first edge section is preferably bendable in such a manner that, at the surface sides of the second edge section pointing in opposite directions, a pressure application is achievable by means of the bendable edge section. Preferably, the first edge section may be provided on at least one of the surface sides of the second edge section, to be able to be brought directly into contact.

According to a further preferred embodiment, the recess may preferably be arranged opposite to the front-side end of the second edge section. A direct path between the recess and the sealant in the connected state of the housing elements preferably runs in an L-shape. Thus, the pressure taking effect on the sealant, for example, through a high-pressure water jet, may be reliably reduced by a substantial degree by which damage to the sealant can be addressed more advantageously. This effect may remain in a preferred design of a supply channel by the fact that the recess is provided in an area opposite to the area of the second housing element that has no supply channel. Thereby, an overlapping of the supply channel with the recess is avoided, as overlapping holds the danger that, for example, the high-pressure water jet hitting the recess may impact the sealant directly with pressure through the supply channel, which could lead to damage to the sealant.

Depending on the use of a control unit housing comprising the housing element, the recess may alternatively be arranged in an area of the first edge section defining a limb of the edge section bendable in a U-shape. If the recess is arranged in the area forming a limb that lies farthest from the sealant when the housing elements are connected, a supply channel leading from the recess to the sealant is advantageous for counteracting any slowing down of the hardening of the sealant compared to an arrangement of the recess closer to the sealant.

According to another preferred embodiment, between the first and second edge section, an intermediary space communicating with the recess in order to provide an air or gas volume close to the sealant, with a proportion of air moisture sufficient for hardening the sealant, can be created. If a direct contact of the recess to the second edge section, preferably to the front-side end of the second edge section, is also conceivable, the supply of air moisture to the sealant may take place only through the column, caused by tolerances, between the contact surfaces of the first and second edge sections, whereas the gas volume able to be supplied to the sealant, and thus the quantity of air moisture able to be supplied to the sealant, is dependent on the dimensions of the column, caused by tolerances, and the path length of the recess to the sealant contact area and/or sealant intake area. With the intermediary space, the path length can be reduced, by which an exchange of the consumed air and/or the consumed gas, which had delivered its proportion of air moisture to the sealant for hardening, with new air/gas may take place more rapidly through the ambient pressure prevalent around the housing element. The intermediary space is able to be formed, for example, through the supply channel, which preferably extends at least in an area overlapping the partial area of the recess. Depending on the point of use of the housing comprising the housing element, such an embodiment may be able to be used advantageously.

As an alternative to this, the intermediary space may be formed according to a further preferred embodiment. In this further preferred embodiment, the U-shape of the bendable edge section can be achieved in a simple manner by bending the first section starting from or through an L-shape into a U-shape, whereas the base of the U-shape automatically forms a bend pointing from the housing element and defining a radius, in which the recess is arranged. Alternatively, the bendable edge section starting from or through the L-shape into a W-shape can be bent, whereas the edge center section made from a base of the W-shape takes a wave shape defined through three consecutive radii. The wave shape comprises two external bends pointing from the housing element and forming a radius, and one middle bend in an opposing direction to the external bends through a radius. The radii may be preferably identical to each other, and/or different from each other. With this preferred embodiment, a limit for the second housing element can be provided above the middle bend. Thereby, in the connected state of the housing elements, a relative displacement of the housing elements to each other may be prevented.

In this preferred embodiment, the at least one recess is arranged in a bend area of the wave shape close to the sealant, whereas the recess preferably extends between the middle bend forming the limit and the adjacent bend near the sealant. Alternatively, the at least one recess may be bordered by an area of the edge center section forming the wave shape, and may extend beyond the full area of the wave shape. In other words, the recess may be preferably arranged adjacent to a material area of the edge center section, which forms the wave shape, whereas the recess between the two external limbs of the first edge section formed as a W-shape may extend from one external bend to the other external bend.

In accordance with an additional aspect of this invention, a housing for a control device, in particular for a motor vehicle control unit, with the characteristics described herein is proposed. Thereby, the advantages described in connection with the preferred embodiments of a housing element may be achieved, whereas the first housing element may have one or more additional characteristics described in connection with these patent claims.

The housing elements may be preferably formed from an injection-molding component, whereas it is preferred that at least one housing element forms a heat sink. For this purpose, this housing element may be preferably formed at least partially from aluminum, further preferably completely from aluminum, whereas the housing element, which does not exhibit a heat sink function, is preferably made of a plastic. An electrical connection between the electronic components that are able to be incorporated in the housing and additional components arranged outside the housing may take place in a usual manner, for example with at least one plug-in connection option forming a housing element. In its form, the housing may be formed in a known method in a manner tailored to the point of use and/or the purpose of use. Thus, the housing may exhibit, for example, a shape that is suitable for incorporating a one-side or two-side fitted circuit board in the housing interior. Additional forms and variations of the housing known to the specialist under consideration of the preferred embodiments described above are conceivable.

According to an additional aspect of this invention, a method for manufacturing a housing for a control unit, in particular for a motor vehicle control unit, is proposed. Thereby, at least one housing formed with the characteristics described herein may be provided. It is also preferable that the first housing element corresponds to a described preferred embodiment of a housing element according to this invention. With a housing formed in such a manner, the aforementioned advantages may be achieved.

Other characteristics and advantages of the invention arise from the following description of a preferred embodiment of the invention, on the basis of the figures of the drawing, which show the details significant for the invention, and from the patent claims. The individual characteristics may be realized individually or severally in any combination for a preferred embodiment of the invention.

BRIEF DESCRIPTION OF THE DRAWINGS

A preferred embodiment of the invention is more specifically described below, on the basis of the attached drawing.

DETAILED DESCRIPTION

Figure 1:
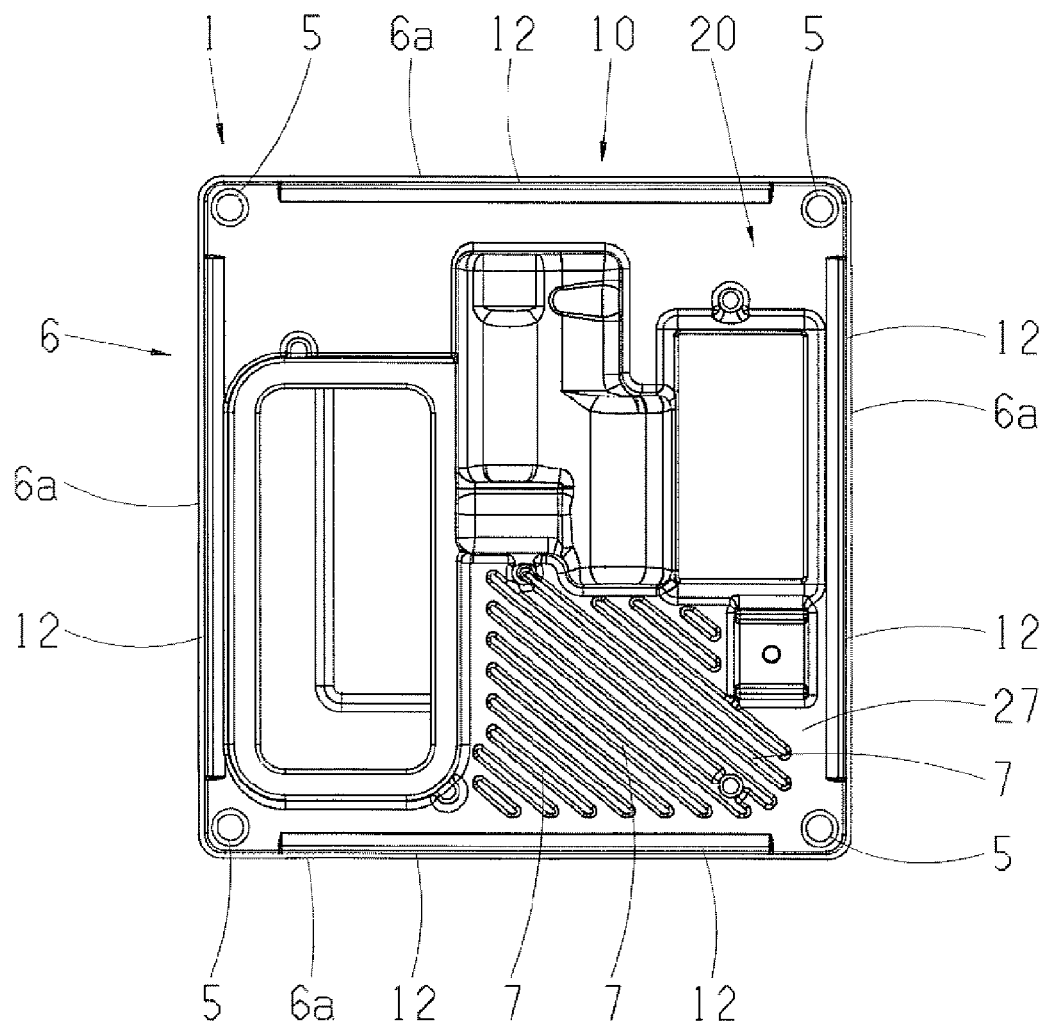
FIG. 1 is a schematic top view of a housing for a control unit according to a preferred embodiment.

Reference will now be made to embodiments of the invention, one or more examples of which are shown in the drawings. Each embodiment is provided by way of explanation of the invention, and not as a limitation of the invention. For example features illustrated or described as part of one embodiment can be combined with another embodiment to yield still another embodiment. It is intended that the present invention include these and other modifications and variations to the embodiments described herein.

FIG. 1 shows a schematic top view of a housing 1 for a control unit according to a preferred embodiment. The rectangular control unit housing 1 features rounded corners, and, in each of the corner areas, includes a through-hole 5 for attaching the control unit housing 1, for example in an engine compartment of a motor vehicle or a motor vehicle transmission. The respective rounded corner areas with the edge sides 6a following thereof in the circumferential direction of the control unit 1 form an edge 6 fully circumferential to the control unit housing 1. The top side 27 of the control unit housing 1 bordered by the edge 6 has a surface structure that essentially corresponds to a contour of electronic components arranged on a circuit board 3 (FIG. 3) in a housing interior 4 of the control unit housing 1. The control unit housing 1 is formed from a cast part, whereas a contour of the electronic components may simply and cost-effectively provide a suitable surface structure.

Figure 2:
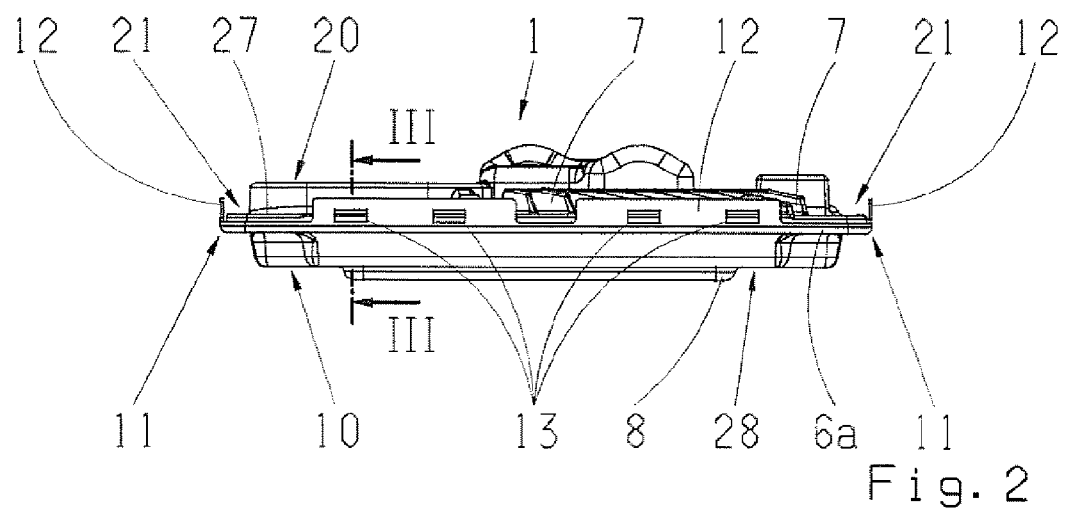
FIG. 2 is a schematic side view of the housing shown in FIG. 1.

FIG. 2 shows a schematic side view of the control unit housing 1 shown in FIG. 1. The control unit housing 1 also includes a first housing element 10 forming a housing bottom and a second housing element 20 forming a housing cover. The housing elements 10, 20 are formed from an aluminum injection-molding component, in order to be able to dissipate heat generated by the electronic components as needed. For this purpose, the housing cover 20, in an area of the top side 27, has several cooling fins 7 running parallel to each other. The housing bottom 10 forms a heat sink 8 on the bottom side 28 of the control unit housing 1 for contact with a heat-dissipating component at a point of deployment or use of the control unit housing 1.

In an edge area of the control unit housing 1, the housing cover 20 comprises a second edge section 21, which is formed flat and is in contact with a first edge section 11 of the housing bottom 10, which is formed flat. The first edge section 11 overlaps the second edge section 21 in a direction defining a side direction of the control unit housing 1, whereas a bendable edge section 12 is directly connected to the overlapping partial section on the side of the second edge section 21, which is formed with the first edge section 11 from one piece, and extends vertically from the housing bottom 10 to the bottom side 28. In a cross cut, the first edge section 11 in the area of the bendable edge section 12 is formed in an L-shape, whereas the mounting state of the control unit housing 1 shown in FIGS. 1 and 2 does not show the final joined state of the control unit housing 1.

As show in FIG. 2, along each side edge of the control unit housing 1, two bendable edge sections 12 are provided with identical design. Each bendable edge section 12 comprises rectangular recesses 13.

Figure 3:
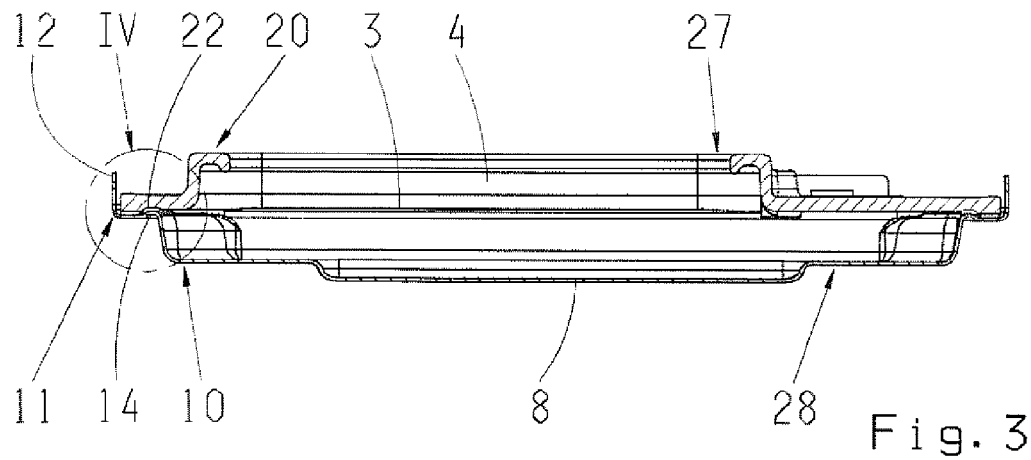
FIG. 3 is a cross-sectional view along the cutting line III-III shown in FIG. 2.
Figure 4A:
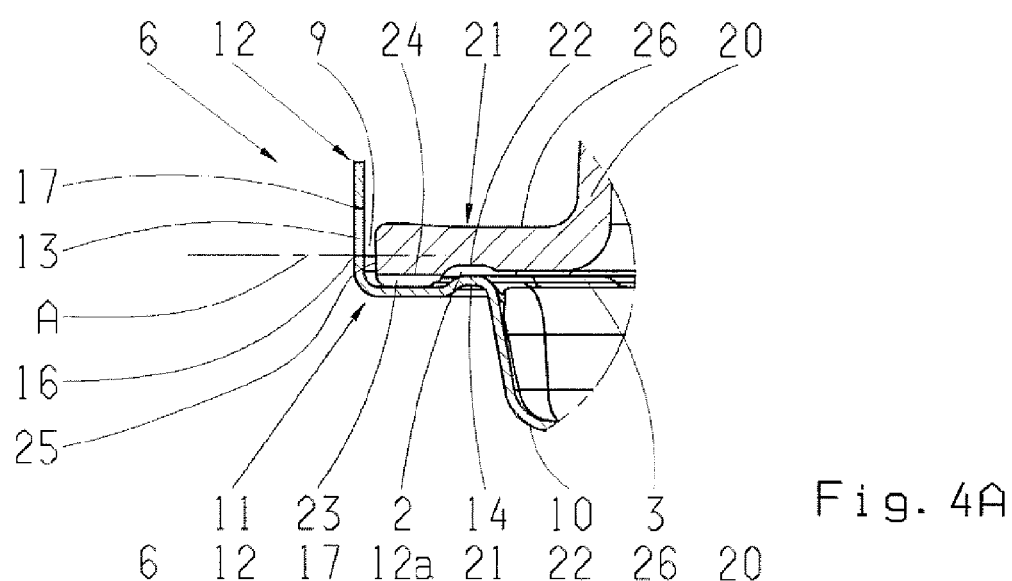
FIG. 4A is an enlarged view of section IV shown in FIG. 3.
Figure 4B:
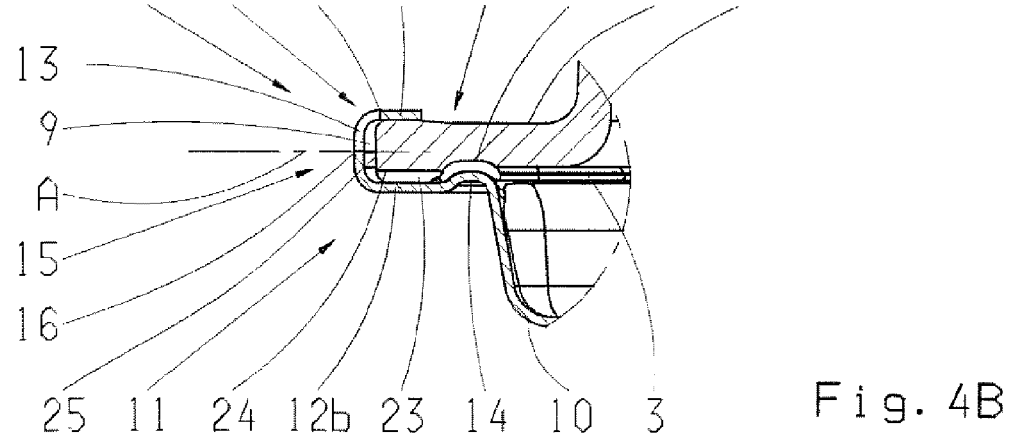
FIG. 4B is an enlarged cross-sectional view of section IV shown in FIG. 4A, with a bent edge section.

FIG. 3 shows a section view of the control unit housing 1 along the cutting line III-III shown in FIG. 2. FIGS. 4A and 4B show an enlarged view of the section IV shown in FIG. 3, whereas FIG. 4B in particular shows the first edge section 11 in a bent state adjacent to the second edge section 21 and thus bordering the second edge section 21.

In detail, FIGS. 3 and 4A show that the second edge section 21 of the housing cover 20 comprises a flat front-side end 25, that the bendable edge section 12 is spaced opposite to the recess 13, and that an intermediary space 9 is formed between the bendable edge section 12 and the front-side end 25. The second edge section 21 also comprises a surface side of a supply channel 23 turned towards the housing bottom 10, which extends from the flat front-side end 25 up to a sealant intake groove 22 formed with the housing cover 20 and pointing in the direction of the housing bottom 10, in which a sealant 2 hardened by means of air moisture is introduced. The supply channel 23 extends in the direction of extension of the edge side 6a with a length that is equal to or larger than an extension length of the recess 13 running parallel to the edge side 6a, and smaller than or equal to an extension length of the bendable edge section 12 running parallel to this. Through this, for example, ambient air that is able to be supplied through the recess 13 and surrounds the control unit housing 1 may be reliably supplied through the supply channel 23 to the sealant 2, in order to ensure a uniform hardening of the sealant 2. Furthermore, damage to the sealant 2 may be effectively counteracted by, for example, a high-pressure water jet, since the supply channel 23 extends exclusively through the areas covered by the bendable edge section 12.

In the area of the first edge section 11, the housing bottom 10 includes an elevation 14, which extends into the sealant intake groove 22. Thereby, a contact surface for the sealant 2 is elevated, by which the sealing function of the control unit 1 can be further improved.

The recess arranged in the first edge section 11 is limited in the direction of the elevation 14 by a lower edge 16, which is advantageously arranged above a supply channel upper edge 24 bounding the supply channel 23. Thereby, a direct adjustment of a high-pressure water jet in the supply channel 23 and thus an unhindered impact of the sealant 2 with the high-pressure water jet and/or with high pressure can be prevented as far as possible. Preferably, the lower edge 16, as shown in FIGS. 4A and 4B, is provided at the height of a middle perpendicular bisector A of the front-side end of the second edge section 21.

An additional measure shown in FIGS. 4A and 4B for the prevention of the direct impact of the sealant 2, for example with a high-pressure water jet, is the providing of the sealant intake area formed between the housing cover 20 and/or the sealant intake groove 22 and the housing bottom 10 and/or the elevation 14, outside of a supply channel entry area formed in the front-side end 25 of the second edge section 21. In particular, for the preferred embodiment, the sealant intake area is formed between a floor of the sealant intake groove 22 and a crown first cut of the elevation 14. Furthermore, the supply channel entry extends to the front-side end 25 from a surface side of the first edge section 21 up to the supply channel upper edge 24. A degree of elevation of the elevation 14 is also selected to the effect that the crown area of the elevation 14 is arranged in the extension of the supply channel upper edge 24.

In the direction of a free end of a bendable edge section 12, the recess of an upper edge 17 is limited, which is formed in such a manner that, in the bent state of the bendable edge section 12, as shown in FIG. 4B, this comes into contact in a transition area between the front-side end 25 and an external surface side 26 of the second edge section 21. Thus, through the mere bending of the bendable edge section 12, a radius running between opposite side edges of the front-side end 25 may be formed, which at the same time defines the intermediary space 9 on an inner side turned towards the front-side end 25 of the bendable edge section 12. A section 12a adjacent to the recess 13 of the bendable edge section 12 rests on the external surface side 26 of the second edge section 21. Preferably, the contact is carried out under a pressure application, in order to be able to border in a clamping manner the housing cover 20 by means of the first edge section 11 to the second edge section 21. In the bent state, the first edge section 11 is U-shaped, whereas the section 12a adjacent to the external surface side 26 of the second edge section 21, an upper limb and a section 12b of the first edge section 11 opposite to the supply channel 23 constitutes a lower limb, and a section 15 of the first edge section 11 running between the two side edges of the front-side end 25 and defining an edge center section constitutes the base of the U-shape.

Figure 5:
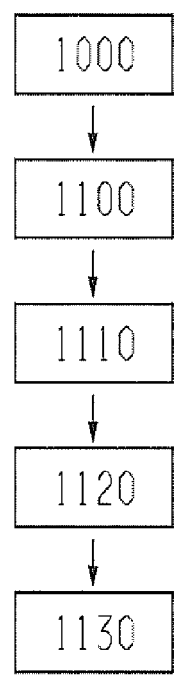
FIG. 5 is a method scheme for the manufacturing of a housing according to a preferred embodiment.

FIG. 5 shows a method diagram for the production of the housing shown in FIGS. 1 to 4B. As a rule, the method for the production of a housing for a control unit comprises a first step 1000, with which the housing bottom 10 and the housing cover 20 is provided, whereas the housing bottom 10 has at least one first edge section 11 with at least one recess 13 and the housing cover 20 with one second edge section 21 able to be brought into contact with the at least one first edge section 11. In a second step 1100, the housing bottom 10 and the housing cover 20 are joined with the intermediate layer of the sealant that is able to be hardened with the assistance of air moisture between the first edge section 11 that is brought into contact and the second edge section 21 that is allocated to it.

For the formation of the preferred embodiment shown in FIGS. 1 to 4B, with the first step 1000, a housing bottom 10 is also provided; this features at least one bendable edge section 12 overlapping the second edge section 21, whereas the bendable edge section 12 forms a partial section of the first edge section 11 brought into contact with the second edge section 21. The recess 13 is arranged in the bendable edge section 12. In addition, with the first step 1000, a housing cover is provided; this also comprises a supply channel 23 for the air moisture leading from the at least one recess 13 to the point of arrangement of the sealant 2. With the shown embodiment, the point of arrangement of the sealant 2 is realized through a sealant intake groove 22 provided with the housing cover 20. Alternatively, with a suitable wall thickness of the housing bottom 10, the sealant intake groove can be provided with the housing bottom 10.

As a further alternative, the sealant intake groove can be formed through a recess formed with the housing bottom 10 and with the housing cover 20, which are arranged opposite to each other in the state of contact of the housing bottom 10 with the housing cover 20.

The second step 1100 includes, after bringing into contact the first housing element 10 with the second housing element 20 to each other, a partial step 1120, with which the bendable edge section 12 is bent to the effect that the at least one recess 13 is brought opposite to the front-side end 25 of the second edge section 21. Through this bending step, the first edge section 11 takes an L-shape. Alternatively, the housing bottom 10 may be provided with such a bendable edge section 12 that is already preformed.

In an additional partial step 1130 subsequent to this, the section 12*a* of the protruding, bendable edge section 12 adjacent to the at least one recess 13 is brought into contact with the external surface side 26 of the second edge section 21 turned away from the sealant 2.

The sealant 2 that is able to be hardened with the assistance of air moisture, which may be (for example) silicone rubber, may be introduced with an intermediate step 1110 between the housing bottom 10 and the housing cover 20, carried out before the partial step 1120 or before the additional partial step 1130. For this purpose, in the first step 1000, the housing bottom 10 and/or the housing cover 20 may be provided with at least one sealant supply channel or several sealant supply channels, through which and/or which the sealant 2 is able to be supplied after the bringing of the first edge section 11 and second edge section 21 in contact with each other in liquid form in the intermediate layer between the housing bottom 10 and the housing cover 20, in particular in the sealant intake groove 22. As an alternative or in addition, the sealant 2 may be supplied through the air supply channel 13, which is able to be provided in the first step 1000 with the housing cover 20.

Modifications and variations can be made to the embodiments illustrated or described herein without departing from the scope and spirit of the invention as set forth in the appended claims.

The invention claimed is:

1. A control unit housing for electronic control components, comprising:
    a first housing element, and a second housing element;
    the first housing element having first edge sections configured for contact with second edge sections of the second housing element, the first edge sections comprising a bendable edge section that bends in a U-shaped configuration in a clamping manner around the second edge sections;
    an intermediate layer of sealant between the first edge sections and second edge sections, the sealant hardened by absorption of air moisture;
    at least one of the first edge sections further comprising a recess disposed such that, in a contacting state of the first and second housing elements, air is conveyed through the recess to the sealant for hardening the sealant in the contacting state of the first and second housing elements, the recess connecting at least two surfaces of the at least one of the first edge sections, the at least two surfaces facing opposite directions, the recess defined in a base center section of the U-shaped configuration of the bendable edge.

2. The control unit housing as in claim 1, wherein the recess is disposed in the first edge sections relative to the sealant such that a portion of the second housing element is disposed between the recess and the sealant in order to prevent a direct line of impact to the sealant through the recess.

3. The control unit housing as in claim 1, wherein a space is defined between the base center section of the U-shaped configuration of the bendable edge and an end of the second edge sections.

4. The control unit housing as in claim 3, further comprising at least one radius in the base center section.

5. The control unit housing as in claim 1, wherein the second housing element comprises a groove for intake of the sealant, and a supply channel for air disposed between the recess and the intake groove.

6. The control unit housing as in claim 5, wherein the supply channel is disposed alongside of the recess.

7. A housing element for use as a component in a control unit housing for electronic control components, the housing element comprising:
    a first edge section configured for contact with a second edge section of a second housing element in the control unit housing, wherein an intermediate layer of sealant is placeable between the first edge section and the second edge section, the sealant hardened by absorption of air moisture, the first edge section comprising a bendable edge section that bends in a U-shaped configuration so as to clamp around the second edge section of the second housing element;
    a recess disposed in the first edge section such that, in a contacting state of the housing element and the second housing element, air is conveyed through the recess to the sealant for hardening the sealant in the contacting state of the housing element and the second housing element, the recess connecting at least two surfaces of the first edge section, the at least two surfaces facing opposite directions, the recess defined in a base center section of the U-shaped configuration of the bendable edge.

8. The housing element as in claim 7, wherein the recess is disposed in the first edge section relative to the sealant such that a portion of the second housing element is disposed between the recess and the sealant in order to prevent a direct line of impact to the sealant through the recess.

9. The housing element as in claim 7, wherein the U-shaped configuration is formed such that a space is defined between the base center section of the U-shaped configuration and an end of the second edge section in a connected state of the housing element with the second housing element.

10. The housing element as in claim 9, further comprising at least one radius in the base center section.

11. A method for producing a control unit housing for electronic control components, the method comprising:
    forming a first housing element and a second housing element, wherein the first housing element has first edge sections configured for contact with second edge sections of the second housing element;
    defining a recess in at least one of the first edge sections, the recess connecting at least two surfaces of the at least one of the first edge sections, the at least two surfaces facing opposite directions;
    joining the first housing element to the second housing element with an intermediate layer of sealant between the first edge sections and second edge sections; and
    wherein the sealant hardens through contact with moisture in air conveyed through the recess to the sealant, the recess defined in a bendable section of the first edge sections that overlap the second edge sections, the joining step comprising bending the bendable section around an end of the second edge sections such that the recess is opposite to the end of the second edge sections and a section of the bendable section is brought into contact against an upper external surface of the second edge sections.

12. The method as in claim 11, further comprising defining a supply channel in the second housing element for conveying air from the recess to the sealant.

13. The method as in claim 12, wherein the sealant is conveyed in liquid form into a sealant intake groove formed between the first edge sections and the second edge sections after the first housing element and second housing element are joined together, the supply channel conveying air to the sealant intake groove.

* * * * *